United States Patent
Steveler et al.

(10) Patent No.: US 10,749,054 B2
(45) Date of Patent: Aug. 18, 2020

(54) PHOTODETECTOR WITH HELMHOLTZ RESONATOR

(71) Applicants: Office National d'Etudes et de Recherches Aérospatiales, Palaiseau (FR); CENTRE NATIONAL DE LA RECHERCHE SCIENTIFIQUE (CNRS), Paris (FR)

(72) Inventors: Emilie Steveler, Strasbourg (FR); Paul Chevalier, Fouras (FR); Jean-Luc Pelouard, Paris (FR); Fabrice Pardo, Vitry sur Seine (FR); Patrick Bouchon, Verrieres le Buisson (FR); Riad Haidar, Paris (FR); Michaël Verdun, Lannion (FR)

(73) Assignees: OFFICE NATIONAL D'ETUDES ET DE RECHERCHES AÉROSPATIALES, Palaiseau (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 118 days.

(21) Appl. No.: 16/158,499

(22) Filed: Oct. 12, 2018

(65) Prior Publication Data

US 2019/0115483 A1 Apr. 18, 2019

(30) Foreign Application Priority Data

Oct. 13, 2017 (FR) ..................... 17 59597

(51) Int. Cl.
*G01J 3/50* (2006.01)
*H01L 31/0232* (2014.01)
*H01L 31/105* (2006.01)
*H01L 31/0352* (2006.01)
*G01N 21/17* (2006.01)

(Continued)

(52) U.S. Cl.
CPC .......... *H01L 31/02327* (2013.01); *G01J 3/50* (2013.01); *G01N 21/1702* (2013.01); *G02B 27/0955* (2013.01); *H01L 31/035227* (2013.01); *H01L 31/105* (2013.01); *H04N 5/374* (2013.01)

(58) Field of Classification Search
CPC ....................................... G01J 3/50
See application file for complete search history.

(56) References Cited

U.S. PATENT DOCUMENTS

2013/0153767 A1* 6/2013 Savoy ................. G01J 1/0429
250/338.1

OTHER PUBLICATIONS

Changlei Zhang et al., "Dual-Bank Wide-Angle Metamaterial Perfect Absorber Based on the Combination of Localized Surface Plasmon Resonance and Helmholtz Resonance", Scientific Reports, vol. 7, No. 1, Jul. 18, 2017 (Jul. 18, 2017) XP055478739, DOI: 10.1038/s41598-017-06087-1, figure 1.

(Continued)

*Primary Examiner* — Thanh Luu
(74) *Attorney, Agent, or Firm* — Young & Thompson

(57) ABSTRACT

A photodetector includes a Helmholtz resonator and a photosensitive structure that is placed in an electric-field-concentrating interval forming part of the Helmholtz resonator. Such a photodetector is in particular suitable for imaging applications. The wavelength of the radiation to be detected is determined by dimensions of the Helmholtz resonator, within a detection spectral interval of the photosensitive structure.

20 Claims, 5 Drawing Sheets

(51) Int. Cl.
*G02B 27/09* (2006.01)
*H04N 5/374* (2011.01)

(56) References Cited

OTHER PUBLICATIONS

Collin Stéphane et al., "Efficient Light Absorption in Metal-Semiconductor-Metal Nanostructures", Applied Physics Letters, A I P Publishing LLC, US, vol. 85, No. 2, Jan. 1, 2004 (Jan. 1, 2001), pp. 194-196, XP012063339, ISSN: 0003-6951, DOI: 10.1063/1.1771467 *figure 1*.
French Search Report, FR 1759597, dated May 29, 2018.
Paul Chevalier et al., "Optical Helmholtz Resonators", Applied Physics Letters, vol. 105, No. 7, ( Aug. 18, 2014 (Aug. 18, 2014), p. 071110, XP055478745, US, ISSN: 0003-6951, DOI: 10.1063/14893786, figure 1, 3.

* cited by examiner

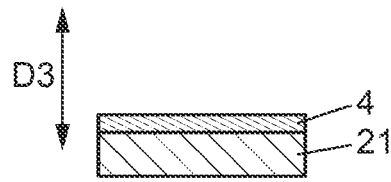
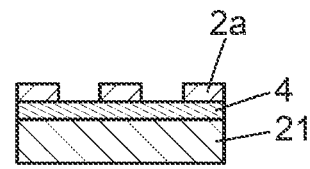
FIG. 6a    FIG. 6b
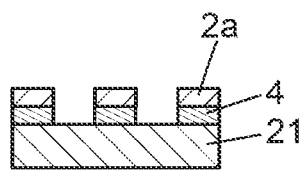
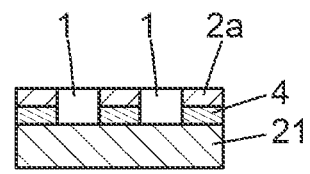
FIG. 6c    FIG. 6d
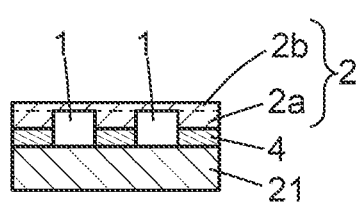
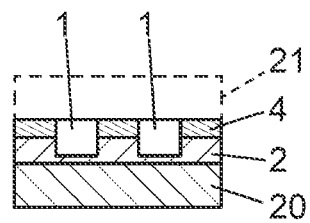
FIG. 6e    FIG. 6f
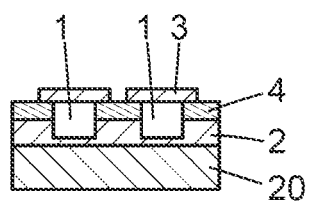
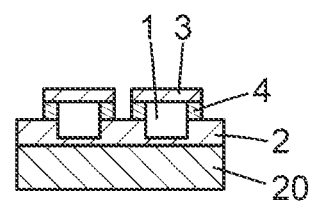
FIG. 6g    FIG. 6h

PHOTODETECTOR WITH HELMHOLTZ RESONATOR

BACKGROUND OF THE INVENTION

Field of the Invention

The present invention relates to a photodetector, to a method for fabricating such a photodetector, and to an image sensor.

Photodetectors are optronic components that are of key importance in many applications, among which digital photography and optical communications. The function of each photodetector is to detect a flux of electromagnetic radiation, and to convert this flux into an electrical quantity that may then be read by an electronic circuit.

Description of the Related Art

At present time, the most commonly used photodetectors are photodiodes fabricated in CMOS technology. However, photodiodes do not have sufficient selectivity with respect to the wavelength of the incident electromagnetic radiation, since it is sufficient for this wavelength to correspond to a photon energy that is higher than the bandgap of the semiconductor used, for the radiation to be detected. Furthermore, photodiodes do not have selectivity with respect to the polarization state of the electromagnetic radiation. For these reasons, when a detection of the radiation is desired, which allows different colours or different polarization states to be distinguished, each photodiode must be combined with a spectral filter or a polarizer. These additional optical components generate additional fabrication costs, and increase assembly complexity as they must be arranged with respect to the photodetectors, in particular within a colour image sensor.

Quantum photodetectors that are efficient in the spectral windows 3-5 µm (microns) and 8-14 µm are also known, but they need to be cooled to cryogenic temperatures, typically less than 77 K (kelvin). This cooling constraint limits or even prevents their use, especially in devices intended for the general public, and substantially increases their cost price.

Other types of photodetectors that are effective in the spectral band from 0.3 µm to 15 µm are also known, such as quarter-wave antennas, for example taking the form of slits or metal-insulator-metal structures. However the combinations of features that they have, between their detection-sensitivity level on the one hand and the width of their detection spectral interval on the other hand, are not suitable for applications such as imaging.

Moreover, Helmholtz electromagnetic-field resonators are known. Such a resonator comprises:
an electrically insulating volume; and
metal faces that surround the insulating volume along at least one looped path that forms a loop around this insulating volume, excepting two interruptions of the looped path, so that the metal faces form two electrodes that are separated from each other by at least one gap, called electric-field-concentrating gap and which contains the interruptions of the looped path.

In such a Helmholtz resonator, the electric-field-concentrating gap has a thickness between both electrodes that is smaller than a thickness of the insulating volume, these thicknesses being measured in a common direction. Thus, when electromagnetic radiation is incident on the resonator, an electric field that is created by this radiation in the resonator is more intense in the electric-field-concentrating gap than in the insulating volume.

In addition, those skilled in the art know how to select the dimensions of the insulating volume and of the metal faces of such a resonator to produce a resonance of the electric field in the electric-field-concentrating gap, at a wavelength desired for the electromagnetic radiation.

SUMMARY OF THE INVENTION

From this situation, one object of the present invention is to provide new photodetectors, each with a detection spectral interval and a selectivity with respect to the polarization of the electromagnetic radiation to be detected that may be chosen at will.

Another object is to provide such photodetectors that have a large detection angular field, and/or a large detection cross section and/or small dimensions, in particular in order to allow image sensors of fine resolution to be produced.

Yet another object is to provide such photodetectors that can be fabricated at low or moderate cost, and that do not require cooling for them to operate.

To this end, a first aspect of the invention proposes photodetector which includes a Helmholtz-resonator-comprising, which is efficient for detecting at least one electromagnetic radiation having a wavelength comprised between 0.3 µm and 15 µm. The photodetector comprises the Helmholtz resonator with its insulating volume and metal faces that have dimensions suitable for producing a resonance of the electric field in the electric-field-concentrating gap when the wavelength of the radiation varies between 0.3 µm and 15 µm.

The photodetector of the invention furthermore comprises:
at least one photosensitive structure, which is based on at least one semiconductor material, which is absorbing for the radiation, which is placed at least partially in the electric-field-concentrating gap, and which is in electrical contact with each of the two electrodes; and
two output electrical connections, which are electrically connected one-by-one to the two electrodes, and which are suitable for transmitting a detection electrical signal that is generated in the photosensitive structure when the radiation is incident on the Helmholtz resonator.

Furthermore, the photosensitive structure has a detection spectral interval that contains a spectral interval of the resonance of the electric field. By analogy with the acoustic domain, the latter condition may be called the condition of tuning the photosensitive structure to the resonator.

Thus, in a photodetector according to the invention, one function of the Helmholtz resonator is to exalt the electric field that is generated by the electromagnetic radiation. This exaltation is produced in the electric-field-concentrating gap. Thus, because the photosensitive structure is placed in this electric-field-concentrating gap, the photodetector has a high sensitivity, and hence it may detect electromagnetic radiations with intensities that are low, or even very low.

Furthermore, another function of the Helmholtz resonator is to operate as a filter of the incident electromagnetic radiation, effective with respect to the wavelength of this radiation. The filter that is thus formed by the Helmholtz resonator has a spectral width of resonance that is sufficient for many applications, in particular imaging applications, thanks to the relatively low values of the Q-factors of Helmholtz resonators for electromagnetic radiations.

Moreover, since the Helmholtz resonator is sensitive to the incident electromagnetic radiation in a large angular sector as regards the direction of incidence of the radiation, the photodetector of the invention itself has a detection angular field that is large. It may therefore be associated with a lens of large numerical aperture, in order to focus the radiation on the photodetector with an area of collection of the radiation that is enlarged.

In addition, thanks to the use of the Helmholtz resonator, the photodetector has a detection cross portion that is large.

Lastly, a photodetector that is according to the invention may have a thickness that is very small, in particular smaller than the wavelength of the detected radiation. This very small thickness achieves the following additional advantages: a dark-current value that may be very low, a better control of the radiative transitions that are used in the photosensitive structure, an electrical transport that is dominated by the drift effect, and a transit time of the photosupports that is very short.

In first configurations of photodetectors comprising Helmholtz resonator, which are in accordance with the invention, the electrically insulating volume may be rectilinear and elongate in a first direction, and each electric-field-concentrating gap may then also be rectilinear and elongate in the first direction. Such photodetectors are selective with respect to the polarization of the electromagnetic radiation, being mainly sensitive to radiation that is linearly polarized and with magnetic field that is parallel to the elongation direction of the insulating volume and of the electric-field-concentrating gap.

In second configurations of photodetectors comprising Helmholtz resonator that are also in accordance with the invention, the electrically insulating volume may have two rectilinear and elongate branches that are perpendicular to each other. In this case, each electric-field-concentrating gap may advantageously comprise, for each branch of the insulating volume, an interval segment that is also rectilinear and elongate parallel to this branch, and that comprises a segment of the photosensitive structure. A photodetector that has such second configuration is sensitive simultaneously and in similar extents to all possible polarization states of the electromagnetic radiation. The photodetector thus produces a detection signal that is representative of the intensity of the radiation, summed over all its polarization states.

Generally, the metal faces of the Helmholtz resonator may form, on the one hand, a cuvette having a bottom and two lateral faces that extend continuously from two opposite sides of the bottom, and may form, on the other hand, a cover face that is located facing the bottom. The insulating volume is then located between the bottom of the cuvette and the cover face, and simultaneously between both lateral faces of the cuvette. Furthermore, each electric-field-concentrating gap is located between a lateral edge of the cover face and an edge of one of the lateral faces of the cuvette, which edge is opposite the bottom of the cuvette. Preferably, both lateral faces of the cuvette may be parallel and separated by a cuvette width that is comprised between 0.05 µm and 0.25 µm. Simultaneously, the bottom of the cuvette and the cover face may be parallel and separated by a thickness of the insulating volume that is comprised between 0.03 µm and 0.25 µm. To this end, the height direction of the insulating volume is measured perpendicularly to the width direction of the cuvette.

Also generally for the invention, the thickness of each electric-field-concentrating gap, when measured from one electrode to the other, may be comprised between 10 nm and 100 nm, and each electric-field-concentrating gap may have a width, measured parallel to at least one of the electrodes at the electric-field-concentrating gap concerned, that is comprised between 10 nm and 50 nm.

Again generally for the invention, each electrode may be at least partially made of one of the following metals: gold, silver, copper, aluminum, or with an alloy comprising at least one of these metals.

In various embodiments of the invention, each photosensitive structure may comprise one among a PiN junction, a portion of a semiconductor, and a quantum-well multilayer stack.

Possibly, the photodetector may furthermore comprise a convergent lens structure that is fixedly placed with respect to the Helmholtz resonator. Such a lens structure may focus the radiation on the Helmholtz resonator, when this radiation is incident on the lens structure. In this case, the photodetector may also furthermore comprise a layer of a material that is transparent to the radiation, which layer is placed between the Helmholtz resonator and the lens structure. The function of this layer is to act as a spacer between the Helmholtz resonator and the lens structure. Thus, the Helmholtz resonator, each photosensitive structure, the layer of the transparent material and the lens structure are securely fastened all together within a rigid block. Handling of the photodetector and its assembly into a device are thus facilitated. In particular, the lens structure may comprise a metal layer that is provided with a hole facing the Helmholtz resonator, and furthermore provided with slits that are placed around the hole in order to form a Huygens lens.

A second aspect of the invention proposes a process for fabricating a photodetector, when this photodetector is in accordance with the first aspect of the invention. The process comprises the following steps:

/1/ on a temporary support, forming each photosensitive structure and a portion of electrically insulating material as the insulating volume, then forming a first one of the electrodes above the photosensitive structure and the insulating volume;

/2/ bonding a final support to the first electrode, on a side thereof that is opposite the temporary support;

/3/ removing the temporary support; and

/4/ depositing a second one of the electrodes on the photosensitive structure and the portion of insulating material, on a side thereof that is opposite the final support.

Lastly, a third aspect of the invention proposes an image sensor that comprises:

a matrix array of photodetectors each of which is in accordance with the first aspect of the invention, these photodetectors being placed at intersections of rows and columns of the matrix array;

an addressing system suitable for selecting each photodetector individually; and a reading system suitable for reading the detection electrical signal that is transmitted by the two output electrical connections of any one of the photodetectors when this photodetector is selected by the addressing system.

Such an image sensor may have a row or column pitch that is comprised between 2 µm and 20 µm when each photodetector is efficient for detecting a radiation the wavelength of which is comprised between 0.8 µm and 15 µm, corresponding to the optical infrared domain.

Alternatively, the row or column pitch may be comprised between 0.1 µm and 2 µm when each photodetector is effective for detecting a radiation with the wavelength comprised between 0.3 µm and 0.8 µm, corresponding to the domain of visible light.

BRIEF DESCRIPTION OF THE DRAWINGS

Other particularities and advantages of the present invention will become apparent from the following description of non-limiting example embodiments, which description is provided with reference to the appended drawings, in which:

FIG. 3b is a graph of spectral reflectivity for the photodetector of FIG. 3a;

FIGS. 6a to 6h are sectional views of an array of photodetectors according to the invention, during manufacture, which illustrate steps of a process for fabricating these photodetectors;

DESCRIPTION OF THE PREFERRED EMBODIMENTS

For the sake of clarity, the dimensions of the elements that are shown in these figures correspond neither to actual dimensions nor to ratios of actual dimensions. Furthermore, identical references that are indicated in various figures designate elements that are identical or that have identical functions.

Figure 1:
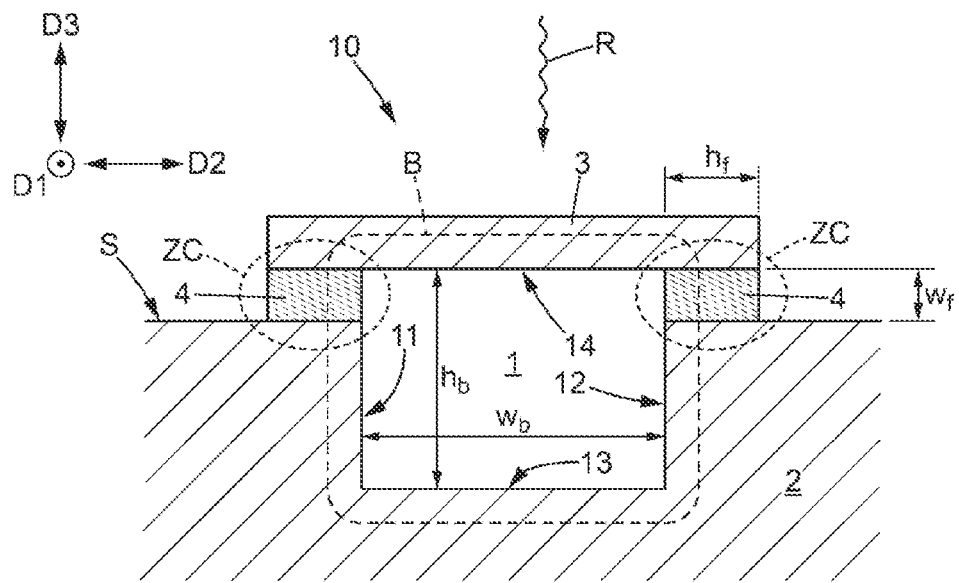
FIG. 1 is a cross-sectional view of a photodetector according to invention.
Figure 2A:
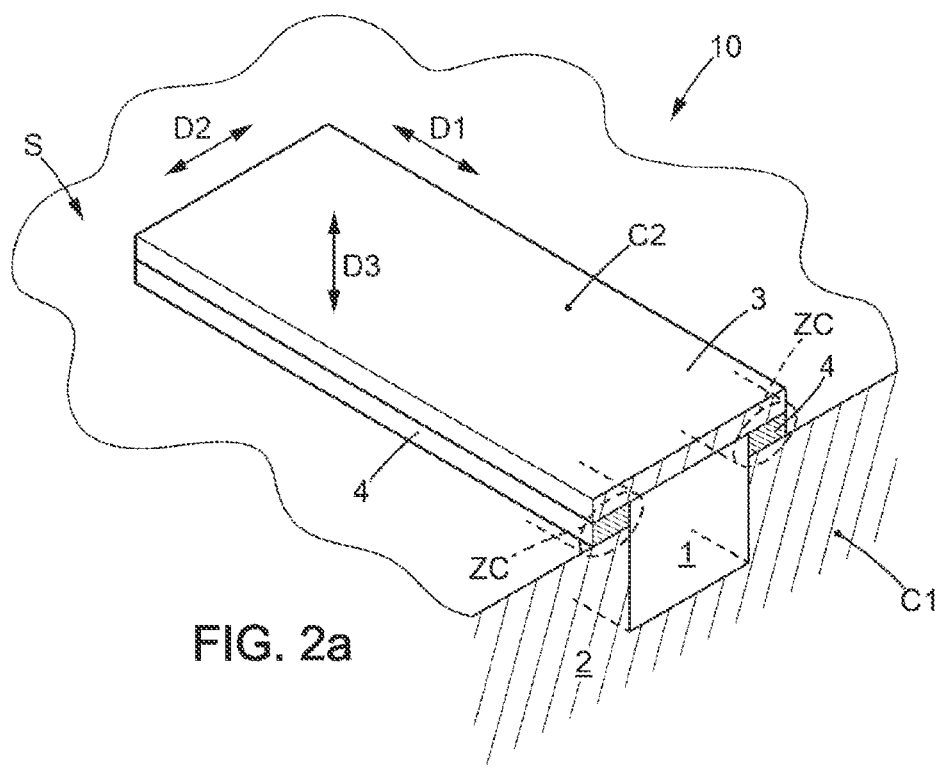
FIGS. 2a and 2b are perspective views of two photodetectors according to the invention, in two different configurations.
Figure 2B:
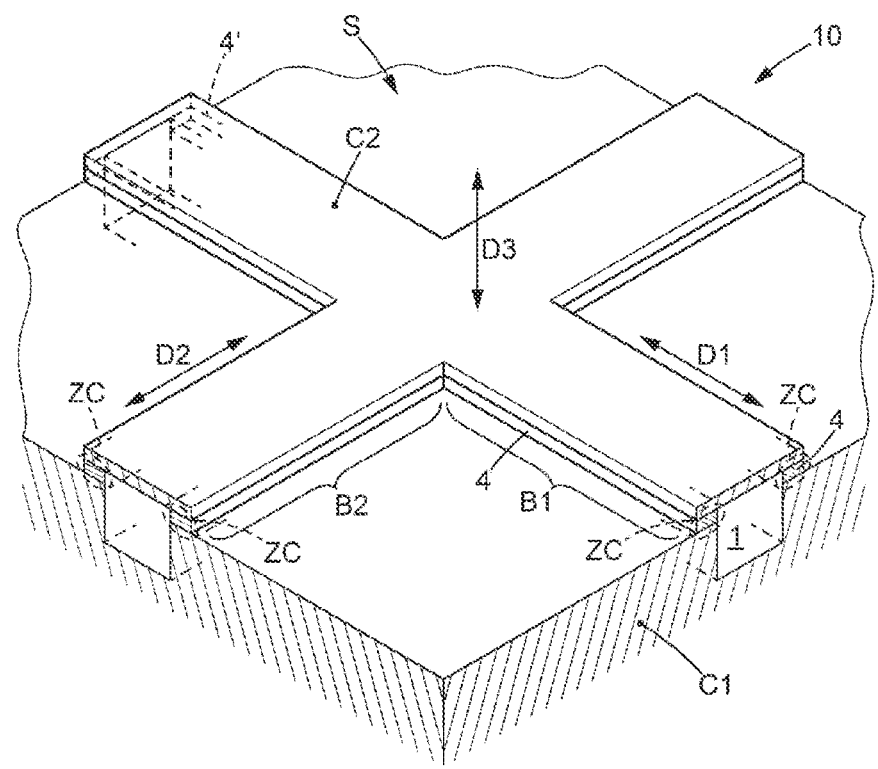

As shown in FIGS. 1, 2a and 2b, a photodetector 10 according to the invention comprises a base layer 2 that has a planar surface S, an electrically insulating volume 1, a cover portion 3 and an intermediate structure 4. The base layer 2 is made of metal, preferably with an electrical conductivity that is high. For example, the base layer 2 may be made of gold (Au) or of copper (Cu). The insulating volume 1 may be comprised of a portion of an electrically insulating material, such as silica ($SiO_2$), which is embedded in the base layer 2 for a main part of this portion. The cover portion 3 is also made of metal, preferably also with an electrical conductivity that is high, and therefore possibly also made of gold. Thus, the base layer 2 has a parallelepipedal cuvette shape from its surface S, with opposite lateral faces 11 and 12, a cuvette bottom 13 and a bottom face 14 of the cover portion 3, this bottom face 14 being oriented toward the interior of the cuvette.

The intermediate structure 4 will be described in detail below. It is located between the surface S of the base layer 2 and the bottom face 14 of the cover portion 3, around the insulating volume 1. It is in electrical contact on the one hand with the base layer 2, and on the other hand with the cover portion 3. The base layer 2 and the cover portion 3 are electrically insulated from each other outside the intermediate structure 4. Unless otherwise indicated, it may be assumed thereafter that the intermediate structure 4 is continuous around the insulating volume 1. However, it may be limited to one or more segments of the periphery of the insulating volume 1, provided that the base layer 2 and the cover portion 3 are electrically insulated from each other outside the intermediate structure 4.

The portion of insulating material fills the cuvette that is formed in the base layer 2, with the intermediate structure 4 that forms a peripheral spacing between the surface S and the cover portion 3. The notations that are indicated in FIG. 1 have the following meanings:

$w_b$ width of the insulating volume 1, measured between the lateral faces 11 and 12 parallel to the direction D2

$h_b$ thickness of the insulating volume 1, measured between the cuvette bottom 13 and the bottom face 14 of the cover portion 3, parallel to the direction D3

$w_f$ thickness of the intermediate structure 4, measured parallel to the direction D3

$h_f$ width of the intermediate structure 4, measured parallel to the direction D2

The loop B that is indicated in FIG. 1 surrounds the insulating volume 1, being contained in the base layer 2 and in the cover portion 3, and by passing through the intermediate structure 4 in two locations that are located between the base 2 and the cover portion 3. The length of each segment of the loop B that is contained in the intermediate structure 4 is substantially equal to the thickness $w_f$. Furthermore, this thickness $w_f$ of the intermediate structure 4 is smaller, and preferably very much smaller, than the thickness $h_b$ of the insulating volume 1. Under these conditions, the portion of the surface S of the base layer 2 that is located facing the peripheral edge of the cover portion 3 forms, with this cover edge, two electrodes of an electrical capacitor. The space that is intermediate between these two capacitor electrodes is denoted ZC. It is distributed between both sides of the insulating volume 1 and forms an electric-field-concentrating gap, in which the electric field is concentrated with respect to an electric-field intensity that may exist within the insulating volume 1. This electric-field-concentrating effect has been referred to as exaltation in the general part of the present description. It is quantified by an exaltation factor G, which is equal to the square of the quotient of the intensity of the electric field in the concentrating gap ZC, over the intensity of the electric field in the insulating volume 1. An approximate value of this exaltation factor is then given by the following formula $G=\lambda^2/(\varepsilon_{SC} \cdot w_f \cdot h_f)$, where $\lambda$ is the wavelength of the electromagnetic radiation R, and $\varepsilon_{SC}$ is the relative dielectric permittivity with respect to vacuum of the material which forms the intermediate structure 4.

Such structure forms a Helmholtz resonator, for which the intensity of the electric field in the concentrating gap ZC presents a resonance as a function of the wavelength of the electromagnetic radiation R that is incident on the whole of this structure. The mid-wavelength of the resonance is given by the formula known to those skilled in the art: $\lambda_r = 2 \cdot \pi \cdot [\varepsilon_{SC} \cdot w_b \cdot h_b \cdot h_f / (2 \cdot w_f)]^{1/2}$. In the formula for G and $\lambda_r$ that have just been given, the length of the insulating volume 1 and of the intermediate structure 4, perpendicular to the plane of FIG. 1, i.e. parallel to the direction D1, is assumed to be much larger than the dimensions $w_b$, $h_b$, $w_f$ and $h_f$. Put another way, the insulating volume 1 and the intermediate structure 4 are elongate parallel to the direction D1, which is called the elongation direction.

For example, when the base layer 2 and the cover portion 3 are made of gold (Au), the insulating volume 1 made of silica ($SiO_2$), and the average refractive index of the intermediate structure 4 is about 3.5, the following dimensions may be used for the Helmholtz resonator: $w_b=0.11$ μm (microns), $h_b=0.10$ μm, $w_f=15$ nm (nanometers) and $h_f=30$ nm. Under these conditions, and when the electromagnetic radiation R has a linear polarization such that its magnetic field is parallel to the elongation direction D1, the resonance wavelength $\lambda_r$ is about equal to 3.25 μm, the exaltation factor G for this wavelength is higher than 100, whereas the quality factor Q of the Helmholtz resonator is only about 10. This low value of the quality factor Q of the Helmholtz resonator allows the photodetector 10 to have a detection spectral width that is sufficient for many applications, in particular imaging applications. Furthermore, these numerical values for $\lambda_r$, G and Q are not significantly modified for inclinations of the direction of incidence of the radiation R that vary between 0° (degree) and 40°, with respect to the direction D3 that is perpendicular to the surface S. For this reason, the photodetector 10 may be efficiently combined with a focusing lens that has a high numerical-aperture value. Thus, the detection of the electromagnetic radiation R is effective in a collection area of this radiation that is enlarged.

As indicated above, the efficiency of the Helmholtz resonator for exalting the electric field of the radiation R in the concentrating gap ZC is higher when this radiation possesses a linear polarization such that its magnetic field is parallel to the elongation direction of the insulating volume 1. Thus, the photodetector 10 of FIG. 2a has a higher sensitivity to the radiation R when this radiation has a linear polarization such that its magnetic field is parallel to the direction D1.

In the photodetector 10 of FIG. 2b, the insulating volume 1 has two branches B1 and B2, which are rectilinear, elongate, perpendicular to each other, and parallel to the directions D1 and D2, respectively. The branch B1 thus has a higher capacity to exalt the electric field of the electromagnetic radiation R when this radiation has a linear polarization such that its magnetic field is parallel to the direction D1. Simultaneously, the branch B2 has a higher capacity to exalt the electric field of the electromagnetic radiation R when this radiation has a linear polarization such that its magnetic field is parallel to the direction D2. By combination, such a photodetector 10 allows the radiation R to be exalted whatever its polarization, and is thus particularly suitable for detecting a radiation that has a natural polarization. Preferably, the electric-field-concentrating gap ZC extends along at least one portion of each arm B1, B2, and thus comprises at least two interval segments that are rectilinear and elongate parallel to the directions D1 and D2, respectively.

According to the invention, the intermediate structure 4, which is located at least partially in the electric-field-concentrating gap ZC, is photosensitive and in electrical contact on the one hand with the base layer 2, and on the other hand with the cover portion 3. The notations C1 and C2 in FIGS. 2a and 2b designate two output electrical contacts, which lead to the base layer 2 for C1, and to the cover portion 3 for C2. These output electrical contacts C1 and C2 are intended to transmit, for example to a reading circuit, an electrical voltage or current that is produced by the radiation R in the photosensitive structure 4. In the general part of the description, the base layer 2 and the cover portion 3 have been called electrodes, with reference to the arrangement thereon of the output electrical contacts C1 and C2.

Thanks to the effect of exaltation of the electric field of the radiation R in the concentrating gap ZC, it is possible to use, for the photosensitive structure 4, embodiments that may have a lower detection efficiency, but which have smaller dimensions and/or which are simpler and less expensive to fabricate.

Figure 3A:
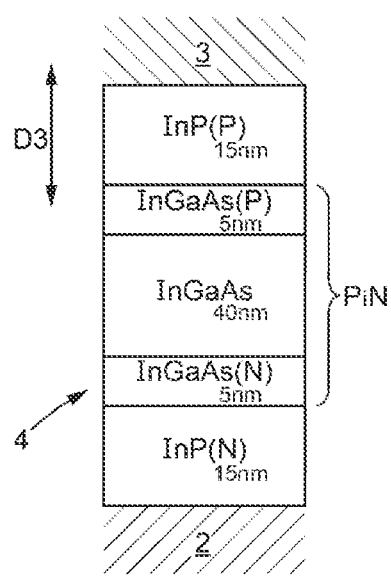
FIG. 3a illustrates a first embodiment for a photosensitive structure of a photodetector according to the invention.

In first possible embodiments, and for photodetectors 10 that are according to the invention, the photosensitive structure 4 may be a PiN junction, the acronym PiN signifying three zones, one of which is doped positively, another of which is doped negatively, and an intermediate zone of which is of intrinsic electrical conductivity. As shown in FIG. 3a, such a PiN junction may be formed by a stack, stacked along the direction D3, of three layers of an alloy of indium (In), gallium (Ga) and arsenic (As), for example with an approximate stoichiometry of $In_{0.53}Ga_{0.47}As$. To decrease a diffusion component of the dark current, it may be advantageous to add two layers of a material that has a bandgap wider than that of the alloy used for the PiN junction, for example two layers of an alloy of indium (In) and of phosphorus (P). Specifically, the respective bandgaps of the alloys $In_{0.53}Ga_{0.47}As$ and InP are 0.74 eV (electron volts) and 1.27 eV. The photosensitive structure 4 then has the configuration that is shown in FIG. 3a, in which (P) designates layers that have been doped positively, and (N) designates layers that have been doped negatively. FIG. 3a also indicates thicknesses, expressed in manometers (nm) and measured along the direction D3, which are possible for each layer of the photosensitive structure 4, corresponding to a total thickness of about 80 nm, equal to the thickness $w_f$ defined above.

Figure 3B:
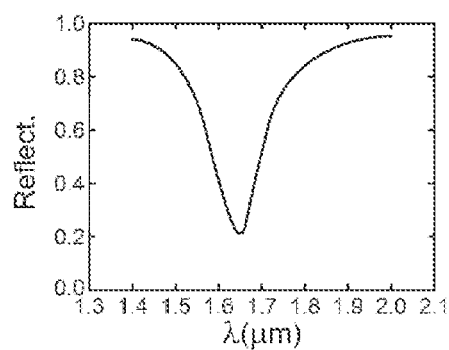

The dimensions of the Helmholtz resonator are selected so that this resonator is tuned to the photosensitive structure 4: the photon energy that corresponds to the resonance wavelength $\lambda_r$ is higher than the bandgap of the alloy used for the PiN junction, plus $k_B \cdot T/2$, where $k_B$ designates Boltzmann's constant and T the operation temperature of the photodetector 10, for example equal to 300 K (kelvin) for a use at room temperature. Under these conditions, the wavelength that corresponds to the maximum sensitivity of the photodetector 10 thus obtained, is equal to about 1.650 μm, and the exaltation factor G is about 140 for this wavelength, when the magnetic field of the radiation R is parallel to the elongation direction of the Helmholtz resonator. The dimensions of the Helmholtz resonator may be the following ones: $w_b$=0.080 μm, $h_b$=0.075 μm, $w_f$=80 nm and $h_f$=25 nm. An offset pitch p between a plurality of photodetectors 10 that have these dimensions and that are according to FIG. 2a or 2b, and that are juxtaposed in the surface S while being offset in the directions D1 or D2, may be 1.1 μm. FIG. 3b reproduces a graph of the reflectivity of the array of photodetectors that is thus obtained, for a radiation R of perpendicular incidence. The horizontal axis indicates the values of the wavelength A, expressed in microns, and the vertical axis indicates the values of the reflectivity denoted Reflect and expressed in percent. The absorption resonance allowing the detection of the radiation R corresponds to a wavelength value of 1.65 μm.

Compared to other photodetectors known before the present invention, the individual detection efficiency of each photodetector may be lower for the present invention. However, the dimensions of each photodetector parallel to the surface S, which are also smaller for the invention, allow values for the detection efficiency per unit area that are higher than those obtained with previous photodetectors.

To decrease efficiency losses due to parasitic electrical currents that take place in proximity to the lateral limits of the photosensitive structure 4, this latter may be continuous between the insulating volume 1 and the cover portion 3, and/or protrude laterally beyond the lateral edges of the cover portion 3.

Figure 4:
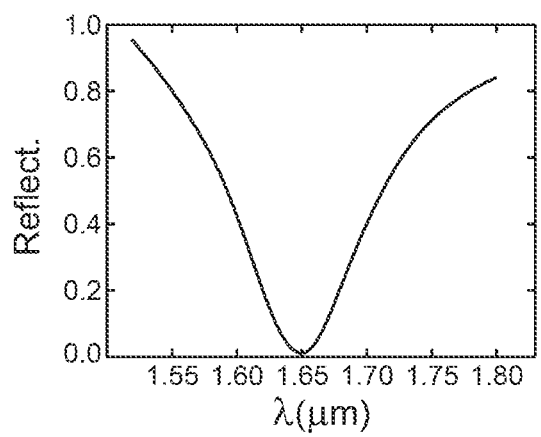
FIG. 4 corresponds to FIG. 3b for a second embodiment of the photosensitive structure.

In second embodiments, which are also possible for photodetectors 10 that are in accordance with the invention, the photosensitive structure 4 may be a portion of a semiconductor. This portion is in contact on the one hand with the base layer 2 and on the other hand with the cover portion 3, thus forming a metal-semiconductor-metal stack. In such a stack, the function of the semiconductor portion is to absorb the energy of the exalted electric field, and the two metal-semiconductor interfaces form two Schottky diodes. The semiconductor of such a photosensitive structure 4 may again be an InGaAs alloy, and the following dimensions lead to a value of 1.650 µm being obtained again for the resonance wavelength $\lambda_r$ of the Helmholtz resonator: $w_b$=0.060 µm, $h_b$=0.050 µm, $w_f$=30 nm and $h_f$=20 nm. The exaltation factor G is then equal to about 350 at the resonance wavelength of 1.650 nm. This value of the factor G is higher than that of the first embodiment described above, because of the lower value of the thickness $w_f$ of the intermediate structure 4. The value of 1.1 µm may be adopted again for the offset pitch p of multiple photodetectors that are juxtaposed in the surface S. FIG. 4 shows the reflectivity spectrum that is obtained under these conditions.

Such second embodiments may produce detection efficiency values that are lower than those of the first embodiments described above, individually for each photodetector 10. However, these individual detection efficiency values that are lower may be compensated for by a higher density of photodetectors in the surface S, corresponding to smaller values for the offset pitch p.

Possibly, photodetectors 10 that are according to such second embodiments may be used to detect electromagnetic radiations using a non-linear absorption mechanism involving two degenerate photons, i.e. two photons of identical wavelengths. In this case, the energy of each of the two photons is comprised between the width of the bandgap of the semiconductor of the photosensitive structure 4, and half of this bandgap width. For example, a photon energy that is equal to 0.41 eV, corresponding to a wavelength of 3 µm, allows detection via absorption of two photons when the semiconductor alloy InGaAs is used, since its bandgap is about 0.74 eV. The Helmholtz resonator must then be dimensioned to produce the resonance at the wavelength of the photons, i.e. 3 µm in the current example. For the following dimensions: $w_b$=0.150 µm, $h_b$=0.135 µm, $w_f$=30 nm and $h_f$=20 nm, the exaltation factor G is equal to about 1950 for the wavelength of 3 µm. An offset pitch p of 2.0 µm may then be used between such photodetectors 10 that are juxtaposed over the surface S. Given that the square of the exaltation factor G is a coefficient in the efficiency of detection of the radiation R via the absorption mechanism involving two degenerate photons, photodetectors 10 that are according to the second embodiments of the invention and that implement this absorption mechanism involving two degenerate photons, may be particularly suitable for detecting radiations at longer wavelength values.

Figure 5A:
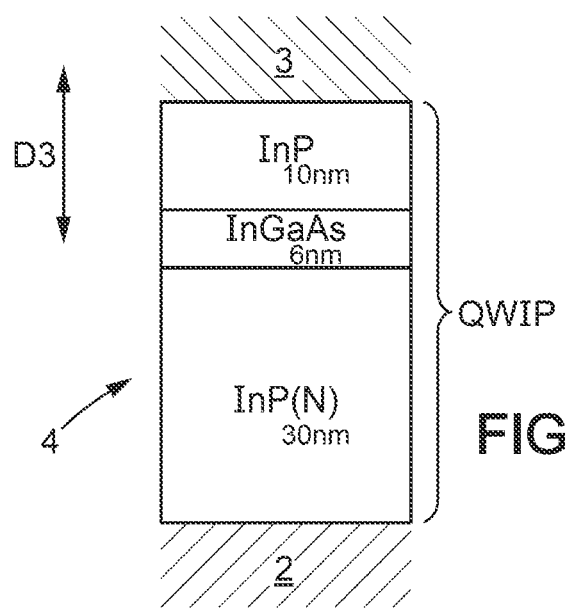
FIGS. 5a and 5b correspond to FIGS. 3a and 3b, respectively, for a third embodiment of the photosensitive structure.
Figure 5B:
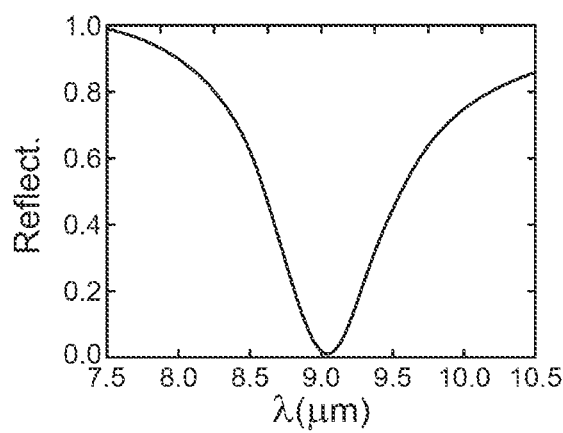

In third embodiments, also possible for photodetectors 10 that are in accordance with the invention, the photosensitive structure 4 may be a quantum-well structure known by the acronym QWIP (for quantum-well infrared photodetector). The operating principle of such a quantum-well structure for detecting an electromagnetic radiation is assumed to be well-known, so that it is not necessary to repeat it here. If necessary, the reader may refer to the relevant scientific literature, which is abundant and widely available. It is simply indicated that for such third embodiments, an electrical biasing voltage must be applied between the output electrical contacts C1 and C2. FIG. 5a shows an example of such photosensitive structure. The layer of indium-phosphorus alloy of 10 nm thickness forms the cathode, the intermediate layer of indium-gallium-phosphorus alloy of 6 nm thickness forms the quantum well, and the other layer of indium-phosphorus alloy, of 30 nm thickness, forms the anode of the QWIP structure. Under these conditions, the photosensitive structure 4 is efficient for detecting an electromagnetic radiation with wavelength of about 9 µm. The following dimensions may be used to tune the Helmholtz resonator to this detection-wavelength value: $w_b$=0.500 µm, $h_b$=0.620 µm, $w_f$=46 nm and $h_f$=20 nm. The offset pitch p between such photodetectors that are juxtaposed in the surface S may be 6.0 µm. Under these conditions, the exaltation factor G is equal to about 3710 in the quantum well, for the wavelength of 9 µm, and an absorption efficiency of the photons of the radiation R in the volume of this well is about 60%. This absorption efficiency value is lower than others produced by structures comprising multiple quantum wells such as reported in the relevant literature, but the small area of the QWIP photosensitive structure 4 such as described above allows dark current to be decreased to a very large extent. Furthermore, such third embodiments allow high densities of photodetectors to be obtained in the surface S, thanks to the dimensions of each photodetector which are also very small. FIG. 5b shows the absorption resonance of an area that contains such juxtaposed photodetectors, according to third embodiments and with the dimensional values that have just been mentioned.

Possibly, photodetectors 10 that are in accordance with third embodiments may be used to detect an electromagnetic radiation using a non-linear absorption mechanism that involves a plurality of degenerate photons. In this way, it is possible to detect radiations that have longer wavelengths, in particular within the spectral band 8-12 µm, and to obtain dark-current values that are even lower.

With reference to FIGS. 6a-6h, a possible process for fabricating juxtaposed photodetectors 10 that are in accordance with the invention will now be described.

In a first step that is illustrated in FIG. 6a, the photosensitive structure 4 is produced on the surface of a temporary support 21, for example a wafer of single-crystal silicon, so as to continuously cover the temporary support 21. The photosensitive structure 4 may be produced by depositing a single material or a plurality of materials, in superposed successive layers where appropriate, depending on the embodiment of this structure, this embodiment in particular being one of the three embodiments that have been described above. Possibly, epitaxial deposition processes may be used.

Metal separating portions 2a, which are for example made of gold, may then be produced on top of the photosensitive structure 4 (FIG. 6b), for example using an e-beam lithography process, followed by deposition of gold and a lift-off step. The separating portions 2a are intended to form the portions of the base layer 2 that are intermediate between two Helmholtz resonators of photodetectors 10 that are neighboring in the surface S.

The photosensitive structure 4 is then selectively removed between the separating portions 2a (FIG. 6c), using an etching process that is suitable for the one or more materials of the structure 4. Such a process may in particular be a wet process, implementing a solution of suitable etching agents. However, this step of removing the photosensitive structure 4 between the separating portions 2a may be omitted in order to preserve the photosensitive structure 4 with a continuous extension under the cover portions 3.

The free volumes thus recovered, between neighboring stacks, which are each formed by a residual portion of photosensitive structure 4 and a separating portion 2a, may be filled with an insulating resist (FIG. 6d). This resist forms the material of the insulating volumes 1.

An additional deposition of metal, in particular gold, is then performed (FIG. 6e), to form an additional layer 2b that continuously covers the separating portions 2a and the insulating volumes 1. The separating portions 2a and the additional layer 2b form the base layer 2 that has been introduced above in the present description for each photodetector 10, and which is also called the first electrode.

A final support 20, for example made of silicon carbide, of insulating material, or which includes electrical connections produced beforehand, is then adhesively bonded on top of the additional layer 2b. The temporary support 21 is then removed, for example by polishing then wet etching. After flipping, the configuration of FIG. 6f is obtained. When the final support 20 includes initially electrical connections, these latter may form the output electrical connections C1 for the photodetectors 10 being fabricated.

The cover portions 3, which are also called second electrodes, are then formed (FIG. 6g), for example using a masking step followed by a step of depositing metal, gold in the present case.

Lastly, the photosensitive structure 4 is etched to the base layer 2 between the cover portions 3 (FIG. 6h).

In this example fabricating process, the base layer 2 forms a first electrode that is common to the photodetectors 10 that have been fabricated simultaneously, and each cover portion 3 forms a separate second electrode that is individually dedicated to one of the photodetectors 10. In alternative embodiments, the base layer 2 may be interrupted between two photodetectors 10 that are neighboring, with an intermediate electrical insulation. Then, the cover portions 3 may be continuous between two photodetectors 10 that are neighboring, in order to form a second electrode that is common to these photodetectors.

Figure 7:
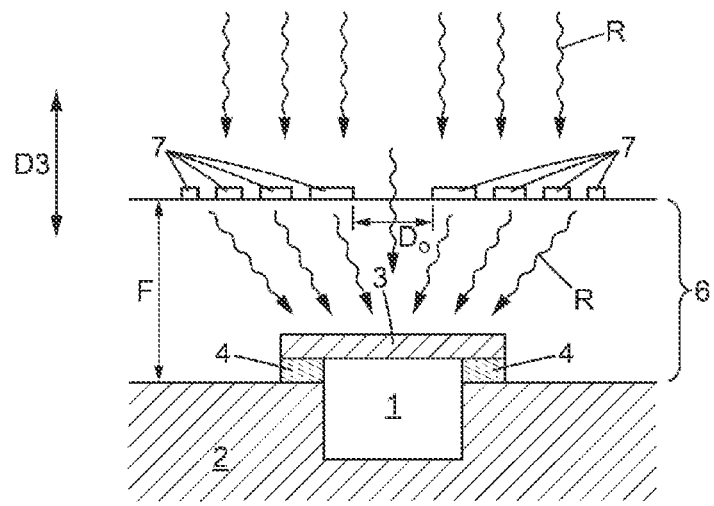
FIG. 7 is a cross-sectional view of a photodetector according to the invention, which is provided with a lens structure.

As shown in FIG. 7, a photodetector 10 that is in accordance with the invention may be associated with a convergent lens structure 7. The lens structure 7 is advantageously securely fastened to the photodetector 10, with an intermediate layer 6 of a material that is transparent to the radiation R to be detected. The layer 6 then possesses a thickness, measured along the direction D3, that is approximately equal to the focal length F of the lens structure 7. Thus, the lens structure 7 focuses the radiation R on the photodetector 10, according to the cross section of this latter. Multiple assembly methods are known to those skilled in the art, for fastening the layer 6 to the photodetector 10 on the one hand, and for fastening the lens structure 7 to the layer 6 on the other hand.

The convergent lens structure 7 may be a piano-convex microlens, or a Fresnel structure. However, preferably, the lens structure 7 may be a Huygens lens, moreover known to those skilled in the art. Such a Huygens lens may be formed by a metal layer that is borne by the layer 6 of the transparent material, and that has a central hole with peripheral slits. It is located facing the photodetector 10, with an alignment along the direction D3. The central hole and the peripheral slits form an optical transmission pattern that produces the focusing function for the radiation R. In particular, the central hole may be circular and centred with respect to the photodetector 10. The focal length F of the Huygens lens, which is effective for the spectral component of the radiation R that has the wavelength $\lambda$, is then given by the formula: $F=D_0^2/(3\cdot\lambda)$, where $D_0$ is the diameter of the central hole. In the case of the present invention, the thickness of the layer 6 along the direction D3 must approximately corresponds to the focal length F for the resonance wavelength $\lambda_r$.

Figure 8:
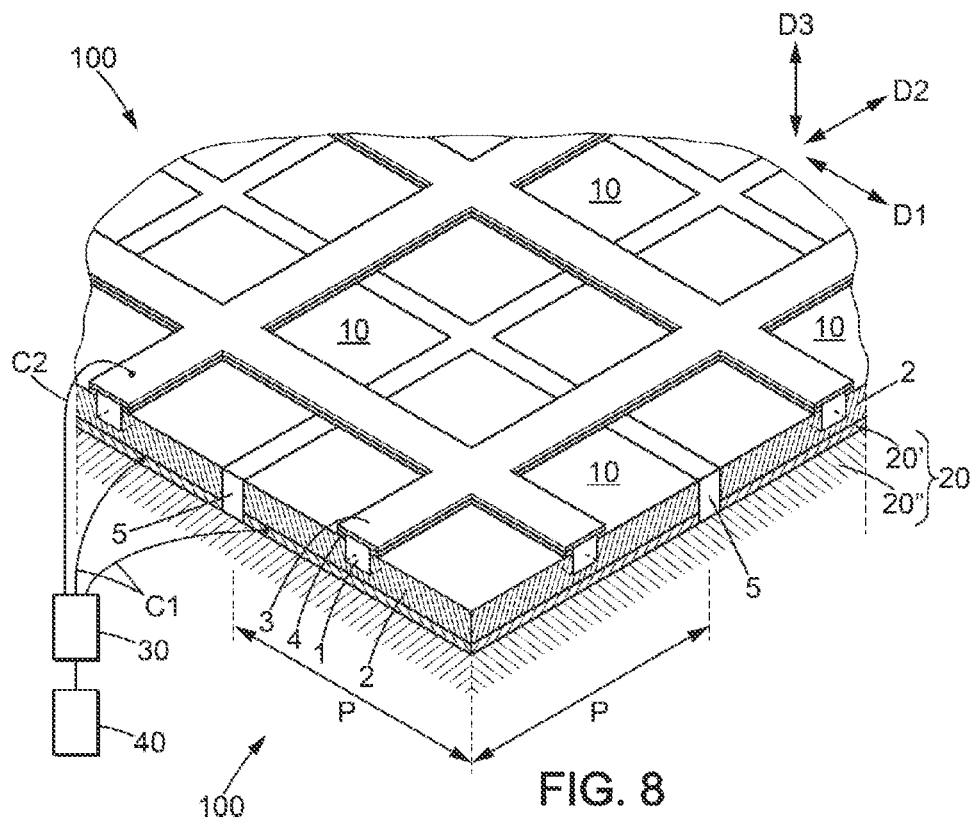
FIG. 8 is a perspective view of an image sensor according to the invention.

The photodetector 10 provided with the lens structure 7, such as shown in FIG. 7, is particularly suitable for forming a pixel of an image sensor 100. Such pixels are then arranged in rows and columns, in a matrix array such as shown in FIG. 8. For the sake of clarity of this figure, the layer of transparent material 6, which may continuously cover all the photodetectors 10, has not been shown, nor the convergent lens structures 7 that are dedicated one-by-one to the photodetectors 10. In the example image sensor that is shown, all the photodetectors 10 share the same metal layer, which forms all the cover portions 3. This layer is patterned to form a grid with square cells, in order to allow the radiation R to reach the electric-field-concentrating gaps ZC. This layer then forms an electrode that is common to all the photodetectors 10 of the image sensor 100. In this case, the base layer 2 is divided into portions that are electrically isolated from one another, and dedicated one-by-one to the photodetectors 10. The reference 5 designates a grid that is formed from an electrically insulating material, such as silica, and that electrically insulates the portions of base layer 2 from one another.

Reference 20' designates a set of layers that is located between the portions of base layer 2 and a base portion 20" of the support 20. The set of layers 20' contains the output electrical connections C1, which are connected to an addressing circuit 30. Such an addressing circuit 30 is also connected at input to the cover portions 3 via the output connection C2, and is connected at output to a reading circuit 40, so as to deliver image data that correspond to each image captured by the sensor 100. Such addressing and reading circuits that are designed for an image sensor are very well known, so that it is not necessary to describe them again here.

The offset pitch p of the rows and columns of pixels in the matrix array of the image sensor 100, may be selected depending on the one or more wavelengths of the one or more radiations to be detected. This offset pitch p in particular depends on the lengths of the branches B1 and B2, in the directions D1 and D2, of the Helmholtz resonators that are used.

Lastly, it is possible to alternate, in the matrix array of the image sensor 100, photodetectors 10 that are in accordance with the invention but designed to detect with respective maximum sensitivities electromagnetic radiations the wavelengths that are different. Thus, a colour image sensor or a multispectral image sensor is obtained. It will be reminded that a photodetector that is in accordance with the invention and that is designed to detect an electromagnetic radiation about a desired wavelength, means that the photosensitive structure is designed to have a sufficient absorption at this wavelength, and that the Helmholtz resonator is dimensioned to have a resonance at the same wavelength.

It will be understood that the invention may be reproduced while modifying secondary aspects thereof with respect to the example embodiments that have been described in detail, while maintaining at least some of the mentioned advantages. Among these advantages, the main ones will now be recalled:

a high exaltation of the electric field, which allows a high detection efficiency;

an absence of harmonic resonances, contrary to the use of other resonators such as Fabry-Perot resonators;

Q-factor values for the Helmholtz resonator that are quite low, allowing the photodetector to be efficient in a detection spectral interval that is quite wide, in particular with a spectral width that may be suitable for imaging applications;

a high tolerance with respect to the inclination of the direction of incidence of the electromagnetic radiation to be detected, allowing the photodetector to be associated with a focusing lens of high numerical aperture;

the possibility of choosing a selectivity of the photodetector with respect to the polarization of the electromagnetic radiation to be detected, or of producing a photodetector that is not selective with respect to this polarization, via the shape of the Helmholtz resonator;
small dimensions of each photodetector; and
the photodetector may be produced in known and already well-mastered technologies, including technologies for fabricating integrated circuits.

In particular, it is possible to place the photosensitive structure 4 only on a limited part of the perimeter of the insulating volume 1, in projection in a plane that is parallel to the surface S. The cover portion 3 is then electrically insulated from the base layer 2 outside the photosensitive structure 4, by a portion of a layer of an insulating material that may advantageously be very thin along the direction D3, in particular thinner than the photosensitive structure 4. The exaltation of the electric field in the concentrating zone ZC that contains the photosensitive structure 4, is then thus even higher.

The invention claimed is:

1. Photodetector (10) which includes a Helmholtz resonator, efficient for detecting at least one electromagnetic radiation (R) having a wavelength comprised between 0.3 µm and 15 µm, the Helmholtz resonator comprising:
an electrically insulating volume (1); and
metal faces (11-14) that surround the insulating volume (1) along at least one looped path that forms a loop around said insulating volume, excepting two interruptions of the looped path, so that the metal faces form two electrodes that are separated from each other by at least one gap, called electric-field-concentrating gap (ZC) and which contains the interruptions of the looped path;
said electric-field-concentrating gap (ZC) having a thickness between both electrodes that is smaller than a thickness of the insulating volume (1), said thicknesses being measured along a common direction (D3), so that when the radiation (R) is incident on the resonator, an electric field that is created by said radiation in the resonator is more intense in the electric-field-concentrating gap than in the insulating volume,
the insulating volume (1) and the metal faces (11-14) having dimensions suitable for producing a resonance of the electric field in the electric-field-concentrating gap (ZC) when the wavelength of the radiation (R) varies between 0.3 µm and 15 µm, and the photodetector (10) furthermore comprising:
at least one photosensitive structure (4), which is based on at least one semiconductor, which is absorbing for the radiation (R), which is placed at least partially in the electric-field-concentrating gap (ZC), and which is in electrical contact with each of the two electrodes; and
two output electrical connections (C1, C2), which are electrically connected one-by-one to the two electrodes, and which are suitable for transmitting a detection electrical signal that is generated in the photosensitive structure (4) when the radiation (R) is incident on the Helmholtz resonator,
the photosensitive structure (4) having a detection spectral interval that contains a spectral interval of the resonance of the electric field.

2. Photodetector (10) according to claim 1, wherein the electrically insulating volume (1) is rectilinear and elongate in a first direction (D1), and each electric-field-concentrating gap (ZC) is also rectilinear and elongate in the first direction.

3. Photodetector (10) according to claim 2, wherein the metal faces (11-14) form both a cuvette having a bottom (13) and two lateral faces (11, 12) that extend continuously from two opposite sides of the bottom, as well as a cover face (14) that is located facing the bottom, so that the insulating volume (1) is located between the bottom of the cuvette and the cover face, and simultaneously between both lateral faces of the cuvette, and each electric-field-concentrating gap (ZC) is located between a lateral edge of the cover face and an edge of one of the lateral faces of the cuvette, which edge is opposite the bottom of said cuvette.

4. Photodetector (10) according to claim 2, wherein the thickness ($w_f$) of each electric-field-concentrating gap (ZC), measured from one electrode to the other, is comprised between 10 nm and 100 nm, and each electric-field-concentrating gap has a width ($h_f$), measured parallel to at least one of the electrodes at said electric-field-concentrating gap, that is comprised between 10 nm and 50 nm.

5. Photodetector (10) according to claim 1, wherein the electrically insulating volume (1) has two rectilinear and elongate branches (B1, B2) that are perpendicular to each other, and each electric-field-concentrating gap (ZC) comprises, for each branch of the insulating volume, a gap segment that is also rectilinear and elongate parallel to said branch, and that comprises a segment of the photosensitive structure (4).

6. Photodetector (10) according to claim 5, wherein the metal faces (11-14) form both a cuvette having a bottom (13) and two lateral faces (11, 12) that extend continuously from two opposite sides of the bottom, as well as a cover face (14) that is located facing the bottom, so that the insulating volume (1) is located between the bottom of the cuvette and the cover face, and simultaneously between both lateral faces of the cuvette, and each electric-field-concentrating gap (ZC) is located between a lateral edge of the cover face and an edge of one of the lateral faces of the cuvette, which edge is opposite the bottom of said cuvette.

7. Photodetector (10) according to claim 5, wherein the thickness ($w_f$) of each electric-field-concentrating gap (ZC), measured from one electrode to the other, is comprised between 10 nm and 100 nm, and each electric-field-concentrating gap has a width ($h_f$), measured parallel to at least one of the electrodes at said electric-field-concentrating gap, that is comprised between 10 nm and 50 nm.

8. Photodetector (10) according to claim 1, wherein the metal faces (11-14) form both a cuvette having a bottom (13) and two lateral faces (11, 12) that extend continuously from two opposite sides of the bottom, as well as a cover face (14) that is located facing the bottom, so that the insulating volume (1) is located between the bottom of the cuvette and the cover face, and simultaneously between both lateral faces of the cuvette, and each electric-field-concentrating gap (ZC) is located between a lateral edge of the cover face and an edge of one of the lateral faces of the cuvette, which edge is opposite the bottom of said cuvette.

9. Photodetector (10) according to claim 8, wherein both lateral faces (11, 12) of the cuvette are parallel and separated by a cuvette width ($w_b$) comprised between 0.05 µm and 0.25 µm, and wherein the bottom (13) of the cuvette and the cover face (14) are parallel and separated by a thickness ($h_b$) of the insulating volume (1) comprised between 0.03 µm and 0.25 µm.

10. Photodetector (10) according to claim 9, wherein the thickness ($w_f$) of each electric-field-concentrating gap (ZC), measured from one electrode to the other, is comprised between 10 nm and 100 nm, and each electric-field-concentrating gap has a width ($h_f$), measured parallel to at least one of the electrodes at said electric-field-concentrating gap, that is comprised between 10 nm and 50 nm.

11. Photodetector (10) according to claim 8, wherein the thickness ($w_f$) of each electric-field-concentrating gap (ZC), measured from one electrode to the other, is comprised between 10 nm and 100 nm, and each electric-field-concentrating gap has a width ($h_f$), measured parallel to at least one of the electrodes at said electric-field-concentrating gap, that is comprised between 10 nm and 50 nm.

12. Photodetector (10) according to claim 1, wherein the thickness ($w_f$) of each electric-field-concentrating gap (ZC), measured from one electrode to the other, is comprised between 10 nm and 100 nm, and each electric-field-concentrating gap has a width ($h_f$), measured parallel to at least one of the electrodes at said electric-field-concentrating gap, that is comprised between 10 nm and 50 nm.

13. Photodetector (10) according to claim 1, wherein each electrode is at least partially made of one of the following metals: gold, silver, copper, aluminum, or with an alloy comprising at least one of said metals.

14. Photodetector (10) according to claim 1, wherein each photosensitive structure (4) comprises one among a PiN junction, a portion of a semiconductor material, and a quantum-well multilayer stack.

15. Photodetector (10) according to claim 1, furthermore comprising a convergent lens structure (7) that is fixedly placed with respect to the Helmholtz resonator so as to focus the radiation (R) on said Helmholtz resonator, when said radiation is incident on the lens structure.

16. Photodetector (10) according to claim 15, furthermore comprising a layer (6) of a material that is transparent to the radiation (R), which layer is placed between the Helmholtz resonator and the lens structure (7), so that the Helmholtz resonator, each photosensitive structure (4), the layer of the transparent material and the lens structure are securely fastened together within a rigid block.

17. Photodetector (10) according to claim 15, wherein the lens structure (7) comprises a metal layer that is provided with a hole facing the Helmholtz resonator, and furthermore provided with slits placed around the hole, in order to form a Huygens lens.

18. Process for fabricating a photodetector (10), said photodetector being according to claim 1, the process comprising the following steps:
/1/ on a temporary support (21), forming said at least one photosensitive structure (4) and a portion of electrically insulating material as the insulating volume (1), then a first one of the electrodes above the photosensitive structure and the insulating volume;
/2/ bonding a final support (20) to the first electrode, on a side of said first electrode that is opposite the temporary support (21);
/3/ removing the temporary support (21); and
/4/ depositing a second one of the electrodes on the photosensitive structure (4) and the portion of insulating material, on a side of said photosensitive structure and of said portion of insulating material that is opposite the final support (20).

19. Image sensor (100) comprising a matrix array of photodetectors (10) each of which is according to claim 1, the photodetectors being placed at intersections of rows and columns of said matrix array, and the image sensor furthermore comprising an addressing system (30) suitable for selecting each photodetector individually, and a reading system (40) suitable for reading the detection electrical signal that is transmitted by the two output electrical connections (C1, C2) of any one of the photodetectors when said photodetector is selected by the addressing system.

20. Image sensor (100) according to claim 19, having a row or column pitch that is comprised between 2 μm and 20 μm when each photodetector (10) is efficient for detecting a radiation (R) with wavelength comprised between 0.8 μm and 15 μm, or having a row or column pitch that is comprised between 0.1 μm and 2 μm when each photodetector is efficient for detecting a radiation of wavelength comprised between 0.3 μm and 0.8 μm.

* * * * *